(12) United States Patent
DeCain et al.

(10) Patent No.: US 6,259,712 B1
(45) Date of Patent: Jul. 10, 2001

(54) INTERFEROMETER METHOD FOR PROVIDING STABILITY OF A LASER

(75) Inventors: Donald Michael DeCain, New York; Philip C. D. Hobbs, Briarcliff Manor, both of NY (US); Keith Randal Pope, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/164,881

(22) Filed: Oct. 1, 1998

(51) Int. Cl.[7] ....................................... H01S 3/13
(52) U.S. Cl. .............................................. 372/32
(58) Field of Search ....................................... 372/32

(56) References Cited

U.S. PATENT DOCUMENTS 5,568,255 * 10/1996 Johnson ................................ 356/352
5,780,843 * 7/1998 Cliche .................................. 250/226
5,999,547 * 12/1999 Schneider .............................. 372/21

* cited by examiner

*Primary Examiner*—Teresa M. Arroyo
*Assistant Examiner*—Gioacchino Inzirillo
(74) *Attorney, Agent, or Firm*—Stephen C. Kaufman, Esq.; McGinn & Gibb, PLLC

(57) ABSTRACT

An interferometric method for providing stability of a laser is enabled by way of utilization of a novel optical interferometric measurement apparatus. The method can enable locking of a laser to a cavity in a bandwidth limited only by propagation delays in the cavity and the tuning behavior of the laser.

20 Claims, 2 Drawing Sheets

INTERFEROMETER METHOD FOR PROVIDING STABILITY OF A LASER

CROSS REFERENCE TO RELATED APPLICATION

This application is related to U.S. Pat. No. 5,986,759, patented to Hobbs et al. and commonly assigned, is incorporated by reference herein.

BACKGROUND OF THE INVENTION

This invention relates to a method suitable for providing stability of a laser.

INTRODUCTION TO THE INVENTION

The present invention complements our work on optical interferometric measurement apparatus, as particularly articulated in the above referenced U.S. Pat. No. 5,986,759. Accordingly, in this introduction, we turn our attention to disclosing important aspects of the optical interferometric measurement apparatus, to thereby provide a basis for motivation and explication of the complementary present invention, summarized below.

The optical interferometric measurement apparatus subsumes several different aspects. Illustrative first and second aspects comprise the following.

In a first aspect, the measurement apparatus includes:
(1) an optical interferometer with at least two optical outputs, the ratio of whose intensities can vary with a tuning parameter; and
(2) at least one detector, each of which is optically connected to the interferometer, and producing in aggregate at least two linearly-independent signals that depend on the light intensity and the tuning parameter, which are combined to produce a first measurement whose sensitivity to light intensity changes is substantially smaller than that of either of the two linearly-independent signals, and a second measurement whose sensitivity to the tuning parameter is substantially smaller than that of either of the two linearly-independent signals.

In a second aspect, the measurement apparatus includes:
(1) an optical interferometer with at least two optical outputs, the ratio of whose intensities can vary with a tuning parameter; and
(2) at least one detector, each of which is optically connected to the interferometer, and producing in aggregate at least two linearly-independent signals which are combined to produce orthogonal measurements of light intensity and the tuning parameter when light of appropriate wavelength and coherence is input to the optical interferometer.

The measurement apparatus, so defined in two aspects, is informed by the classical Fabry-Perot technique, with a view to overcoming most of its limitations and cited problems, thereby advantageously realizing unusually sensitive and stable optical interferometric measurement capabilities.

SUMMARY OF THE INVENTION

It is intimated above that the present invention can complement the just disclosed optical interferometric measurement apparatus. We have discerned that this complementary action can come about from turning one's attention from its employment as a measurement apparatus, to a disparate activity centering on its employment as a vehicle for providing frequency stabilization of a laser.

This discovery may be manifest in the following ways.

In a first aspect, we disclose a method suitable for providing stability of a laser, the method comprising:
(1) providing a tunable laser capable of outputting a first beam;
(2) providing an apparatus receiving at least a portion of said first beam, the apparatus including:
  (i) an optical interferometer with at least two optical outputs each comprising at least one portion derived from said first beam, the ratio of whose intensities can vary with the tuning of the laser; and
  (ii) a detector which is optically connected to the interferometer and producing at least two linearly independent signals that depend on the light intensity and the tuning of the laser, which are combined to produce a measurement whose sensitivity to light intensity changes is substantially smaller than that of either of the two linearly independent signals; and
(3) servoing the laser tuning by reference to fluctuations in the measurement.

In this aspect, the servoing of the laser tuning preferably comprises using a deviation of the measurement from a set point as an error signal in a feedback loop controlling the tuning of the laser.

In a second aspect, we disclose a method suitable for providing stability of a laser, the method comprising:
(1) providing a tunable laser capable of outputting a first beam of frequency ω and power P;
(2) providing an apparatus receiving at least a portion of said first beam, the apparatus including:
  (i) a Fabry-Perot interferometer whose input comprises at least one portion derived from said first beam, producing reflected (R) and transmitted (T) beams, the ratio of whose power can vary with ω the tuning of the laser; and
  (ii) a photodetector which is optically connected to the interferometer and producing at least two linearly independent signals corresponding to the optical power in the R and T beams, which are combined to produce a measurement whose sensitivity to changes in P is substantially smaller than that of either of the R and T signals; and
(3) servoing the laser tuning by reference to fluctuations in the measurement.

In this second aspect, the providing of the apparatus may comprise adjusting the gain of at least one of the R and T signals in order to reduce the magnitude of $$\frac{\partial V(R)}{\partial P} - \frac{\partial V(T)}{\partial P}$$

when the condition V(R)−V(T)=0 holds, where V(R) and V(T) are the voltages of the R and T signals, respectively.

Alternatively, the providing of the apparatus in this second aspect may comprise attenuating at least one of the R and T beams in order to reduce the magnitude of $$\frac{\partial V(R)}{\partial P} - \frac{\partial V(T)}{\partial P}$$

when the condition V(R)−V(T)=0 holds.

The servoing of the laser tuning in this second aspect preferably comprises using a deviation of the first measurement from a set point as an error signal in a feedback loop controlling the tuning of the laser.

BRIEF DESCRIPTION OF THE DRAWING

The invention is illustrated in the accompanying drawings, in which.

DETAILED DESCRIPTION OF THE INVENTION

The present invention, as summarized above, discloses methodology suitable for providing stability of a laser e.g., a tunable diode laser. The detailed description of the present invention unfolds in three stages. In stage one, illustrative prior art methodology is set forth in apposition to the present invention, in order to sharply contrast the novelty of the present invention with the prior art. Stage two provides a detailed description of an apparatus preferably employed in realization of the present invention. Stage three discloses preferred aspects of the present invention, centering on the stage two apparatus.

An important and illustrative prior art methodology for effecting frequency stabilization of a laser to a cavity is the Pound-Drever technique. Here, a small dither at low frequency is applied to the laser tuning (often by current tuning a diode laser), and the modulations of the transmitted light are detected. When the laser is tuned to the center of the transmission peak, no fundamental component will be detected. Unfortunately, we note, the bandwidth of this technique is limited by the lock-in detection used, and the modulation of the laser amplitude interferes with the accuracy of the measurement. Thus, cavities of extremely high finesse are required to get good locking.

The present invention, however, in sharp contrast to the Pound-Drever technique, can enable locking the laser to the cavity in a bandwidth limited only by propagation delays in the cavity and the tuning behaviors of the laser; bandwidth of several megahertz are easily possible. Furthermore, owing to the shot-noise limited nature of the measurement, frequency stabilities of the order of 1 part in $10^{12}$ can be obtained with an inexpensive low-finesse cavity, with no residual modulation from a dither signal. These virtues allow the use of ultrahigh sensitivity extinction and spectroscopic measurements in cost-sensitive technological applications, which usually require high degrees of simplicity and robustness.

Figure 1:
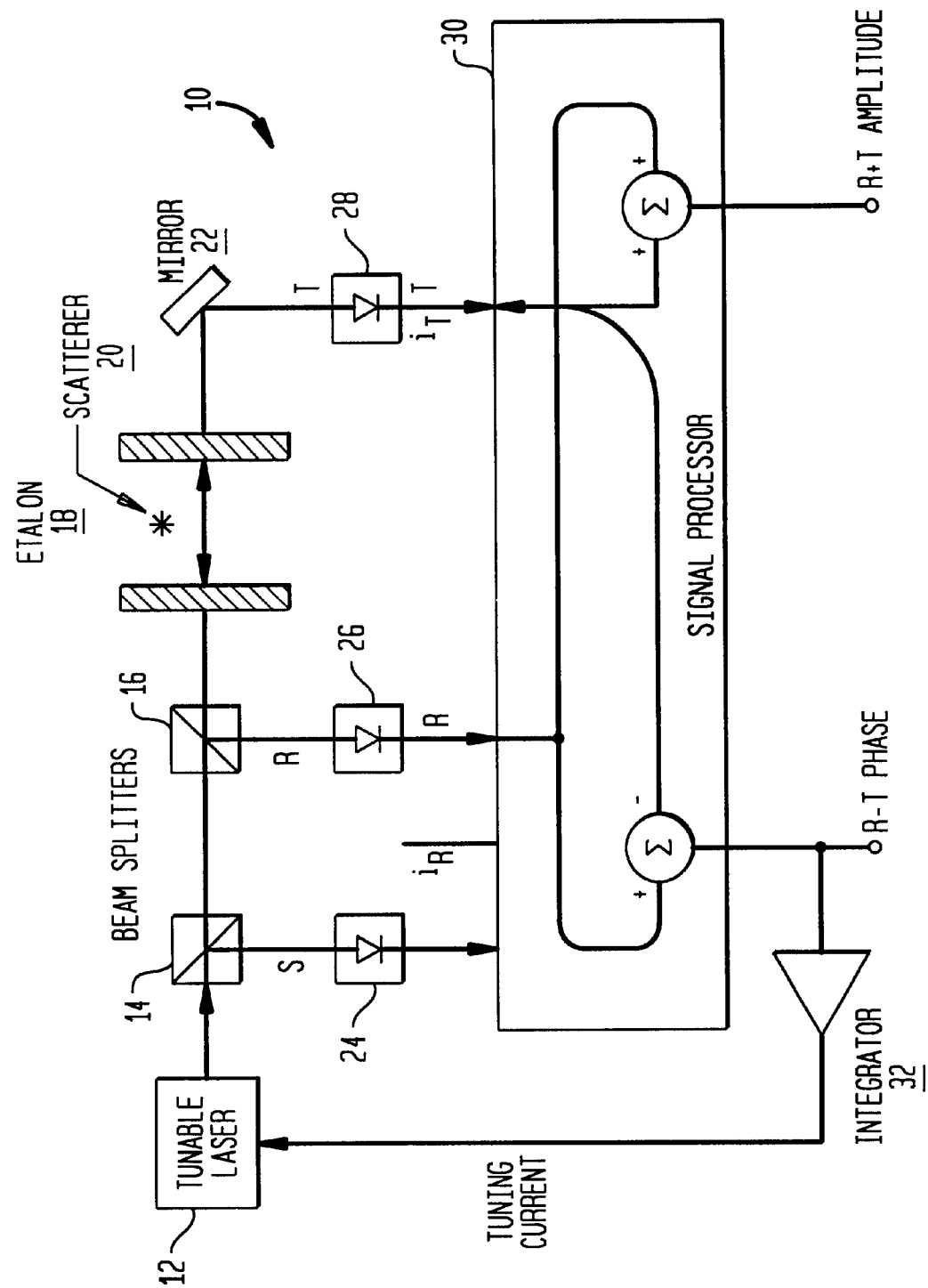
FIG. 1 shows a tunable-laser apparatus which preferably is employed in the method of the present invention.

Attention is now directed to FIG. 1, which shows preferred apparatus suitable for realization of the present method.

In particular, FIG. 1 shows a tunable-laser apparatus 10. A beam from a tunable laser 12 (e.g., a diode laser) passes through beam splitters 14, 16, then into an etalon 18. Inside the cavity is a scatterer 20, which causes an extinction ε and a phase perturbation δφ in one pass of the beam. A transmitted (T) beam and reflected (R) beam, together with a sample of the laser output (S) are detected and fed to a signal processor 30. This signal processor 30 consists of a differential version of a noise canceller, and puts out two voltages which are related to the ratio of the sum (R+T) and difference (R−T) of the reflected and transmitted beams to the sample beam. This processor 30 can eliminate the effect of laser noise and spurious signals above the shot noise level, allowing the system to operate right at the shot noise limit. The R−T output is integrated (32) and fed to the tunable laser 12 as its tuning current; this stabilizes the operating point of the system half way up the resonance curve of the etalon, where R−T is zero. (See FIG. 2).

In the absence of absorption, the sum of the reflectance R and transmittance T is unity; any phase change inside the cavity will redistribute the total beam power between the transmitted and reflected beams, resulting in a nonzero R−T signal; this will persist for a short time, during which the servo loop adjusts the operating wavelength of the laser to zero it out. An extinction signal unaccompanied by any phase shift will cause optical loss inside the cavity; by conservation of energy, the sum signal T+R must decrease. For small extinctions, where the total reduction in R+T is several percent or less, the operating point is stable, because R and T decrease by almost exactly the same amount, so the amplitude perturbation does not cause any apparent phase perturbation. In this way, the amplitude and phase of the scatter signal can be measured separately, to great accuracy.

If there is significant excess loss in the cavity already, the stability of the operating point will be degraded somewhat. It can be restored by taking a slightly different linear combination of R and T (e.g., T−0.9R for one particular value of extinction) as the phase signal. The exact factors required will depend on the excess loss encountered.

A Fabry-Perot interferometer with a finesse of 1000 has high selectivity; the rate of change of its reflected and transmitted beam intensity as a function of frequency, dR/df and dT/df, are of the order of $1000/f0$. Similarly, both depend linearly on the input beam intensity. The logarithmic output of the laser noise canceller described in U.S. Pat. No. 5,134,276 to Hobbs provides the ratio of the beam powers incident on its two photodetectors, and suppresses the laser intensity information by a factor of at least 20 dB and as much as 60 dB, even when the two beams are unequal in power. Thus the logarithmic output provides an amplitude-insensitive measure of the relative tuning of the laser and the Fabry-Perot. Alternatively, choosing the set point so that R−T=0 will produce a zero baseline measurement in which an intensity shift produces a change of slope but not of offset, much like a balanced mixer used as a phase detector in a phase-locked loop. In both cases, amplitude shifts do not cause the null point to move, so that the tuning set point is not disturbed.

If the two photocurrents are added together instead (with a slight modification to the circuitry, both can be done at once), after being linearly scaled (with an optical neutral density filter before detection or a resistor network after detection, for example) so that dR/df=−dT/df at the chosen set point, then small changes in the tuning parameter will make one signal increase and the other decrease, producing very much smaller relative changes in their sum. Thus, we can make a tuning-insensitive measurement of the light intensity alone. A third detector, sampling the laser beam alone, can be used as in the patent just cited, to provide a comparison current to cancel the laser noise down to the shot noise level, leaving only signals due to transient extinction events in the cavity. This noise cancellation will in principle be as effective as that of the difference or logarithmic output.

The sensitivity of this approach is very high. With a 5 mW laser at 632.8 nm, the shot noise is equivalent to an absorption uncertainty of 1 part in $10^8$ in 1 second, so with an etalon with an energy density enhancement of a factor of $10^3$, a 1-second measurement could in principle measure an extinction of $10^{-11}$. It could also measure phase perturbation as small as $10^{-12}$ radians.

Figure 2:
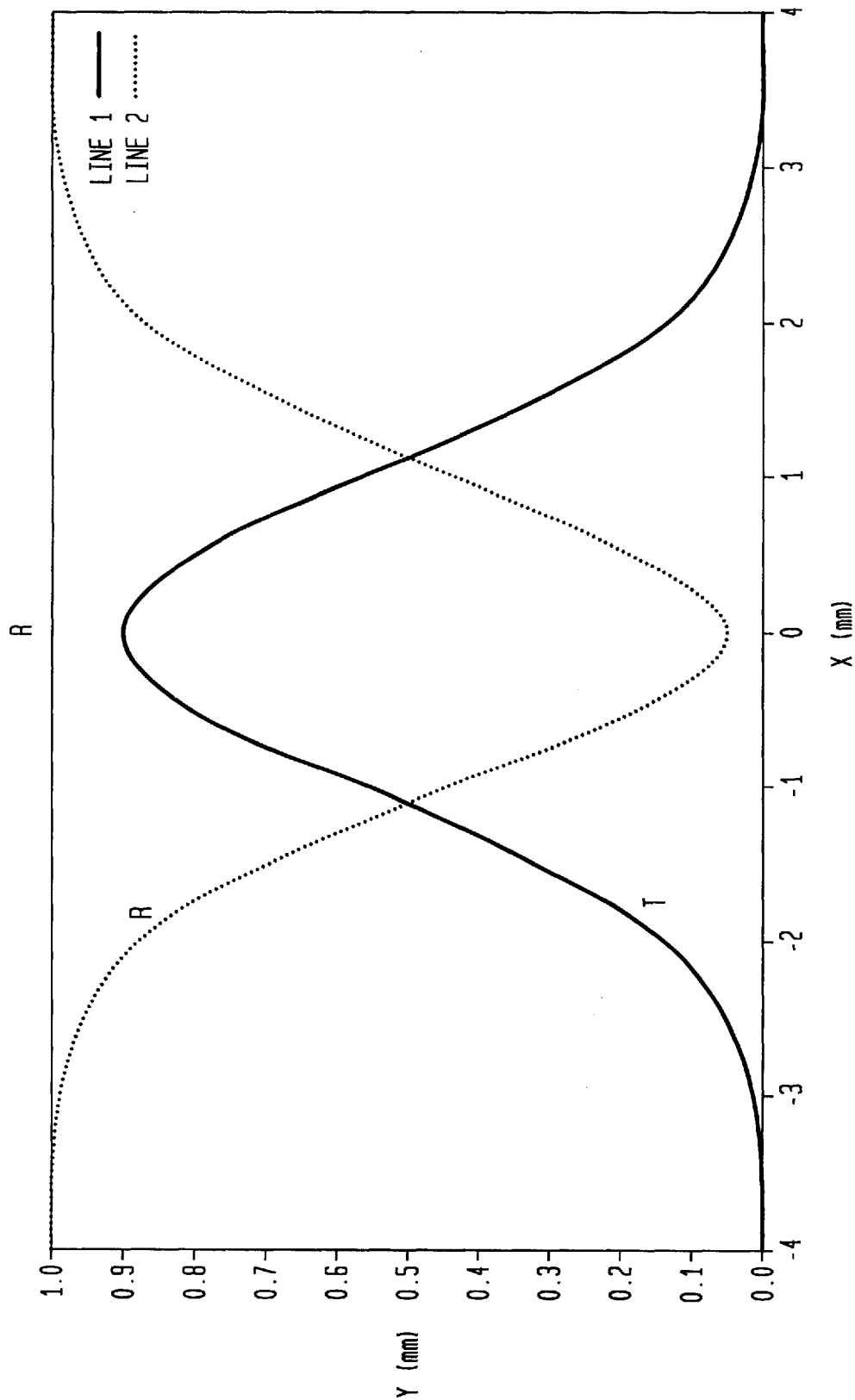
FIG. 2 shows signals generated by the FIG. 1 apparatus which are useful for explaining the method of the present invention.

A servo loop controlling the laser tuning so as to make V(R−V(T)=0 in FIG. 2 will thus have very low additive noise due to laser intensity fluctuations. The gain term (partial (V(R)−V(T)))/(partial f) is of the order of V(R)*finesse/FSR, where FSR is the free spectral range, so a high gain servo loop can stabilize the laser tuning to an accuracy of the order of $10^{-8}$ FSR/finesse hertz in 1 second.

A 2 cm long fused silica etalon with a finesse of 100 has a FSR of 10 GHz, so the tuning stability in a 1 Hz bandwidth is of the order of 1 Hz. The laser must be sufficiently stable to begin with that the required loop gain is within reach, but this is feasible with currently available distributed feedback lasers or ordinary cleaved-cavity diode lasers with external optical feedback.

What is claimed is:

1. A method for providing stability of a laser, the method comprising:
    (1) providing a tunable laser capable of outputting a first beam;
    (2) providing an apparatus receiving at least a portion of said first beam, the apparatus including:
        (i) an optical interferometer with at least two optical outputs each comprising at least one portion derived from said first beam, the ratio of whose intensities can vary with the tuning of the laser; and
        (ii) a detector which is optically connected to the interferometer and producing at least two linearly independent signals that depend on the light intensity and the tuning of the laser, which are combined to produce a measurement when sensitivity to light intensity changes is substantially smaller than that of either of the two linearly independent signals; and
    (3) servoing the laser tuning by reference to fuctuations in the measurement.

2. A method according to claim 1, wherein said providing of said tunable laser comprises providing a diode laser.

3. A method according to claim 1, wherein said servoing of the laser tuning comprises using a deviation of the measurement from a set point as an error signal in a feedback loop controlling the tuning of the laser.

4. The method of claim 1, wherein no one of said two independent signals necessarily contains both tuning and amplitude information, and
    wherein said method eliminates an amplitude modulation component in the signal.

5. The method of claim 1, wherein said two linearly-independent signals are derived from the transmitted and reflected beams from an etalon.

6. The method of claim 1, wherein said laser is locked to the cavity in a bandwidth limited only by propagation delays in the cavity and a tuning of the laser.

7. The method of claim 4, wherein said method separates out the amplitude and tuning information, and uses a pure tuning error signal to control the laser frequency.

8. A method for providing stability of a laser, the method comprising:
    (1) providing a tunable laser capable of outputting a first beam;
    (2) providing an apparatus receiving at least a portion of said first beam, the apparatus including:
        (i) an optical interferometer with at least two optical outputs each comprising at least one portion derived from said first beam, the ratio of whose intensities can vary with the tuning of the laser; and
        (ii) a detector which is optically connected to the interferometer and producing at least two linearly independent signals that depend on the light intensity and the tuning of the laser, which are combined to produce a first measurement whose sensitivity to the light intensity changes is substantially smaller than that of either of the two linearly independent signals, and a second measurement whos sensitivity to the tuning of the laser is substantially smaller than that of either of the two linearly independent signals; and
    (3) servoing the laser tuning by reference to fluctuations in the first measurement.

9. The method of claim 8, wherein no one of said two independent signals necessarily contains both tuning and amplitude information, and
    wherein said method eliminates an amplitude modulation component in the signal.

10. The method of claim 8, wherein said two linearly-independent signals are derived from the transmitted and reflected beams from an etalon.

11. The method of claim 8, wherein said laser is locked to a cavity in a bandwidth limited only by propagation delays in the cavity and a tuning of the laser.

12. The method of claim 9, wherein said method separates out the amplitude and tuning information, and uses a pure tuning error signal to control a frequency of the laser.

13. A method for providing stability of a laser, the method comprising:
    (1) providing a tunable laser capable of outputting a first beam of frequency ω and power P;
    (2) providing an apparatus receiving at least a portion of said first beam, the apparatus including:
        (i) a Fabry-Perot interferometer whose input comprises at least one portion derived from said first beam, producing reflected (R) and transmitted (T) beams, the ratio of whose powers can vary with co the tuning of the laser; and
        (ii) a photodetector which is optically connected to the interferometer and producing at least two linearly independent signals corresponding to the optical power in the R and T beams, which are combined to produce a measurement whose sensitivity to changes in P is substantially smaller than that of either of the R and T signals; and
    (3) servoing the laser tuning by reference to fluctuations in the measurement.

14. A method according to claim 13, wherein said providing of said apparatus comprises adjusting the gain of at least one of the R and T signals in order to reduce the magnitude of $$\frac{\partial V(R)}{\partial P} - \frac{\partial V(T)}{\partial P}$$

when the condition V(R)−V(T)=0 holds, where V(R) and V(T) are the voltages of the R and T signals, respectively.

15. A method according to claim 13, wherein said providing of said apparatus comprises attenuating at least one of the R and T beams in order to reduce the magnitude of $$\frac{\partial V(R)}{\partial P} - \frac{\partial V(T)}{\partial P}$$

when the condition V(R)−V(T)=0 holds.

16. A method according to claim 13, wherein said servoing of the laser comprises using a deviation of the measurement from a set point as an error signal in a feedback loop controlling the tuning of the laser.

17. The method of claim 13, wherein no one of said two independent signals necessarily contains both tuning and amplitude information, and wherein said method eliminates an amplitude modulation component in the signal.

18. The method of claim 13, wherein said two linearly-independent signals are derived from the transmitted and reflected beams from an etalon, and wherein said method separates out the amplitude and tuning information, and uses a pure tuning error signal to control a frequency of the laser, and wherein said laser is locked to a cavity in a bandwidth limited only by propagation delays in the cavity and a tuning of the laser.

19. A method for providing stability of a laser, the method comprising:
   (1) providing a tunable laser capable of outputting a first beam of frequency $\omega$ and power P;
   (2) providing an apparatus receiving at least a portion of said first beam, the apparatus including:
      (i) a Fabry-Perot interferometer whose input comprises at least one portion derived from said first beam, producing reflected (R) and transmitted (T) beams, the ratio of whose power can vary with $\omega$ the tuning of the laser; and
      (ii) a photodetector which is optically connected to the interferometer and producing at least two linearly independent signals corresponding to the optical power in the R and T beams, which are linearly combined to produce a difference measurement whose sensitivity to changes in P is substantially smaller than that of either of the R and T signals, and a sum measurement whose sensitivity to $\omega$ is substantially smaller than that of either of the R and T signals; and
   (3) servoing the laser tuning by reference to fluctuations in the difference measurement.

20. The method of claim 19, wherein no one of said two independent signals necessarily contains both tuning and amplitude information, and said method eliminates an amplitude modulation component in the signal, wherein said two linearly-independent signals are derived from the transmitted and reflected beams from an etalon, and said method separates out the amplitude and tuning information, and uses a pure tuning error signal to control a frequency of the laser, and wherein said laser is locked to a cavity in a bandwidth limited only by propagation delays in the cavity and a tuning of the laser.

* * * * *